(12) United States Patent
Joshi et al.

(10) Patent No.: US 11,387,095 B2
(45) Date of Patent: Jul. 12, 2022

(54) PASSIVATION STRUCTURING AND PLATING FOR SEMICONDUCTOR DEVICES

(71) Applicant: Infineon Technologies Austria AG, Villach (AT)

(72) Inventors: Ravi Keshav Joshi, Klagenfurt (AT); Andreas Behrendt, Villach (AT); Richard Gaisberger, Velden (AT); Anita Satz, Villach (AT); Johanna Schlaminger, Villach (AT); Johann Schmid, Villach (AT); Mario Stanovnik, Villach (AT); Juergen Steinbrenner, Noetsch (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/999,308

(22) Filed: Aug. 21, 2020

(65) Prior Publication Data
US 2022/0059347 A1    Feb. 24, 2022

(51) Int. Cl.
| | | |
|---|---|---|
| *H01L 21/02* | (2006.01) | |
| *H01L 21/768* | (2006.01) | |
| *H01L 23/528* | (2006.01) | |
| *H01L 21/306* | (2006.01) | |
| *H01L 21/3213* | (2006.01) | |

(52) U.S. Cl.
CPC .. *H01L 21/02167* (2013.01); *H01L 21/02334* (2013.01); *H01L 21/02378* (2013.01); *H01L 21/30604* (2013.01); *H01L 21/32134* (2013.01); *H01L 21/76874* (2013.01); *H01L 23/5283* (2013.01)

(58) Field of Classification Search
None
See application file for complete search history.

(56) References Cited

U.S. PATENT DOCUMENTS

| | | | |
|---|---|---|---|
| 6,730,982 B2* | 5/2004 | Barth | H01L 21/76849 257/529 |
| 2015/0325535 A1* | 11/2015 | Henneck | H01L 24/03 438/656 |
| 2017/0154856 A1* | 6/2017 | Standing | H01L 23/3135 |
| 2017/0250147 A1* | 8/2017 | Yu | H01L 24/05 |
| 2017/0309583 A1* | 10/2017 | Konrath | H01L 29/7395 |
| 2018/0076321 A1* | 3/2018 | Goller | H01L 29/34 |
| 2018/0166407 A1* | 6/2018 | Lin | H01L 24/05 |

\* cited by examiner

*Primary Examiner* — Alexander G Ghyka
(74) *Attorney, Agent, or Firm* — Murphy, Bilak & Homiller, PLLC (57) ABSTRACT

Described herein is a method and a power semiconductor device produced by the method. The method includes: forming a structured metallization layer above a semiconductor substrate; forming a protective layer on the structured metallization layer; forming a first passivation over the structured metallization layer with the protective layer interposed between the first passivation and the structured metallization layer; structuring the first passivation to expose one or more regions of the protective layer; removing the one or more exposed regions of the protective layer to expose one or more parts of the structured metallization layer; and after structuring the first passivation and removing the one or more exposed regions of the protective layer, forming a second passivation on the first passivation and electroless plating the one or more exposed parts of the structured metallization layer.

19 Claims, 7 Drawing Sheets

PASSIVATION STRUCTURING AND PLATING FOR SEMICONDUCTOR DEVICES

BACKGROUND

Passivation is widely used in power semiconductor devices such as power MOSFETs (metal-oxide semiconductor field-effect transistors) to protect against corrosion over the device lifetime. The passivation typically includes one or more layers of oxide and nitride which act mainly as a humidity barrier to protect against corrosion of metal or semiconductor beneath the passivation. In case of copper metallization, passivation cannot be deposited directly on copper, as copper tends to react with the deposition chemistry of the passivation, creating a layer of copper silicide. Accordingly, a thin (e.g. about 6 nm to 12 nm thick) layer of aluminum oxide is typically deposited on copper metallization using atomic layer deposition (ALD). The thin layer of aluminum oxide facilitates the deposition of passivation on the copper metallization and improves the adhesion between these two layers.

Due to very high electric field at the chip (die) edge, SiC-based MOSFETs require thick passivation (e.g. about 4 µm thick) to protect the chip termination area against humidity induced corrosion. The thin layer of aluminum oxide must be removed from the copper metallization to perform electroless copper plating. However, the aluminum oxide etching chemistry is not very selective to Cu. Therefore, some Cu deposits on the sidewalls of the passivation. More Cu is deposited if imide is used as a mask to open the passivation. That is, by etching the passivation using imide as a mask, plasma radicals attack the imide surface making it susceptible to intake of copper contamination during etching of the protective layer that covers the structured metallization layer.

Also, an integration scheme that allows for passivation structuring with selective stopping on copper together with good and clean growth of a sinterable, solderable and wire-bondable layer of NiP/Pd/Au layer on the copper surface is technically challenging. Present electroless plating on copper techniques deposit passivation before the growth of an electrolessly deposited layer. Furthermore, imide is deposited on the semiconductor wafer after the completion of the electroless plating process. However, to gain good adhesion of imide on electroless plated copper, the electroless deposition process is split into two parts. First, a NiMoP/Pd layer is grown and then oxidized to promote imide adhesion. After imide lithography, palladium is reduced to facilitate gold flash. The 2-part electroless deposition process involves numerous process steps and additional process costs. Furthermore, NiMoP is typically used to facilitate imide curing even though NiP is preferred over NiMoP.

Thus, there is a need for an improved passivation structuring and plating process for semiconductor devices.

SUMMARY

According to an embodiment of a method, the method comprises: forming a structured metallization layer above a semiconductor substrate; forming a protective layer on the structured metallization layer; forming a first passivation over the structured metallization layer with the protective layer interposed between the first passivation and the structured metallization layer; structuring the first passivation to expose one or more regions of the protective layer; removing the one or more exposed regions of the protective layer to expose one or more parts of the structured metallization layer; after structuring the first passivation and removing the one or more exposed regions of the protective layer, forming a second passivation on the first passivation and electroless plating the one or more exposed parts of the structured metallization layer.

According to an embodiment of a power semiconductor device, the power semiconductor device comprises: a semiconductor substrate; transistor device structures formed in the semiconductor substrate; a structured metallization layer above the semiconductor substrate; a first passivation over the structured metallization layer; a second passivation on the first passivation; an opening formed in the first passivation and the second passivation such that a first part of the structured metallization layer has a contact region uncovered by the first passivation and the second passivation and a peripheral region laterally surrounding the contact region and covered by the first passivation and the second passivation, the first passivation and the second passivation covering a sidewall and a top surface of the peripheral region; a plating that covers the contact region but not the peripheral region of the first part of the structured metallization layer; and a protective layer separating the peripheral region of the first part of the structured metallization layer from the first passivation.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein is a passivation structuring and plating process for semiconductor devices. The process includes etching a first passivation formed on a structured metallization layer to expose part of the underlying metallization layer without contaminating sidewall surfaces of an overlying passivation, thereby allowing electroless plating of the exposed part of the metallization layer without plating the sidewall surfaces of the overlying passivation. The overlying passivation is formed after structuring the first passivation and after removing a protective layer from the part of the metallization layer that is exposed by structuring the first passivation, ensuring the overlying passivation is free of metal contaminants. Accordingly, the exposed part of the structured metallization layer may be electroless plated through openings in both passivation structures without plating the sidewall surfaces of the overlying passivation.

An additional lithography layer may be used to structure the first passivation formed on the structure metallization layer. After the passivation structuring, a protective layer is removed from the exposed metal surface using the first passivation as a hard mask. After these steps, the overlying passivation is formed, e.g., by performing an imide lithography process.

The passivation structuring and plating process described herein offers clean structuring of the passivation stack, proper resist removal after passivation etch without discoloration (oxidation) of open/exposed metal pads, removal of a protective layer from the exposed metal pads without contaminating the surface or sidewall of the overlying passivation, and allowing uniform deposition of an electroless plated layer without flitters, side wall plating or discoloration.

Figure 1:
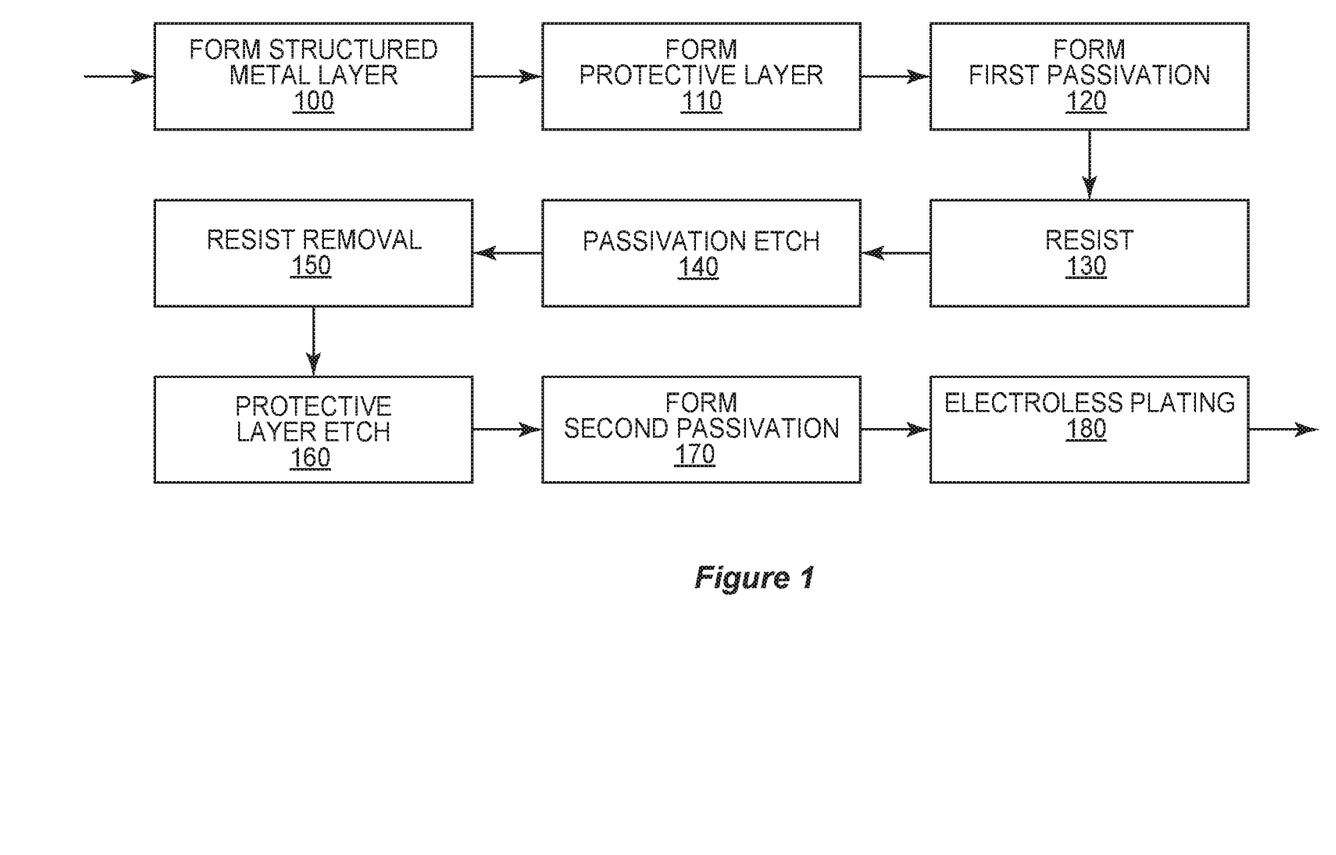
FIG. 1 illustrates a flow diagram of an embodiment of a passivation structuring and plating process.

FIG. 1 illustrates an embodiment of the passivation structuring and plating process. FIGS. 2A through 2H illustrate respective partial cross-sectional views of a power semiconductor device during different stages of the process. The process of FIG. 1 is explained below in connection with the cross-sectional views of FIGS. 2A through 2H.

Figure 2A:
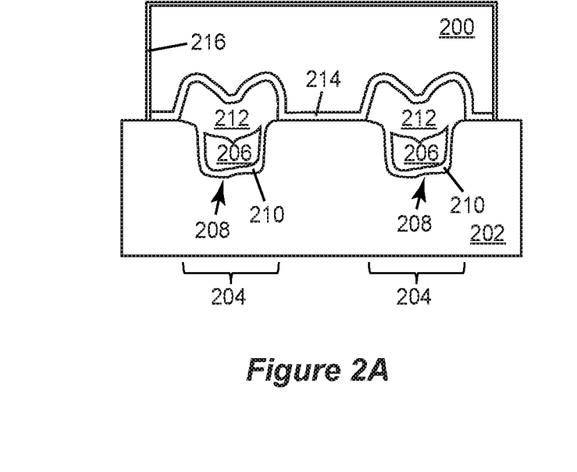
FIGS. 2A through 2H illustrate respective partial cross-sectional views of a power semiconductor device during different stages of the process shown in FIG. 1.

The process of FIG. 1 includes forming a structured metallization layer 200 above a semiconductor substrate 202 (Block 100), as shown in FIG. 2A. In one embodiment, the structured metallization layer 200 is a power metallization layer that provides one or more power connections for transistor device structures 204 formed in the semiconductor substrate 202. For example, in the case of a power MOSFET, IGBT (insulated gate bipolar transistor) or HEMT (high-electron mobility transistor) device, the structured metallization layer 200 may provide at least a source or emitter potential to the transistor device structures 204. In the case of a lateral power device, the structured metallization layer 200 may also provide a drain or collector potential to the transistor device structures 204. For vertical power devices, the drain/collector potential may be provided at the opposite side of the semiconductor substrate 202 which is out of view in FIGS. 2A through 2H. The structured metallization layer 200 may also provide one or more signal connections for the transistor device structures 204. For example, the structured metallization layer 200 may provide gate signal connections to the transistor device structures 204.

In FIGS. 2A through 2H, the transistor device structures 204 are illustrated as trench gate device structures in that gate electrodes 206 are disposed in trenches 208 formed in the semiconductor substrate 202. The gate electrodes 206 are electrically insulated from the semiconductor substrate 202 by a gate dielectric 210 and from the overlying structured metallization layer 200 by an interlayer dielectric 212 such as an oxide and/or a nitride. The structured metallization layer 200 instead may be spaced apart from the semiconductor substrate 202 by one or more intermediary metallization layers and corresponding interlayer dielectrics (not shown). The power semiconductor device instead may be a planar gate device with the gate electrodes 206 disposed above and electrically insulated from the semiconductor substrate 202 by the gate dielectric 210. The transistor device structures 204 also include doped semiconductor regions formed in the semiconductor substrate 202 such as, but not limited to, source/emitter, body, drift, drain/collector, field stop, etc. The doped semiconductor regions of the transistor device structures 204 are not shown in FIGS. 2A through 2H for ease of illustration.

The semiconductor substrate 202 may include one or more of a variety of semiconductor materials that are used to form power semiconductor devices such as power MOSFETs, IGBTs, HEMTs, etc. For example, the semiconductor substrate 202 may include silicon (Si), silicon carbide (SiC), germanium (Ge), silicon germanium (SiGe), gallium nitride (GaN), gallium arsenide (GaAs), and the like. The semiconductor substrate 202 may be a bulk semiconductor material or may include one or more epitaxial layers grown on a bulk semiconductor material.

The metallization layer 200 formed above the semiconductor substrate 202 may be structured using any standard structuring technique for metallization layers in semiconductor devices. For example, the structured metallization layer 200 may comprise copper (Cu) and be formed by depositing a Cu barrier layer 214 such as TiW and depositing Cu on the Cu barrier layer 214. Other barrier materials may be used, depending on the type of metalliztaion being used. The Cu barrier 214 and Cu layer may be structured by lithography and etching to form the structured metallization layer 200. The structured metallization layer 200 instead may be a structured aluminum copper (AlCu) layer, a structured silver (Ag) layer, or a structured gold (Au) layer. In each case, the metallization layer 200 may be structured to form gate runners, source runners, etc. In one embodiment, the metallization layer 200 is the uppermost metallization layer and structured to form contact pads such as source and/or gate contact pads.

The passivation structuring and plating process further includes forming a protective layer 216 on the structured metallization layer 200 (Block 110), as shown in FIG. 2A. The protective layer 216 prevents silicide formation, and/or prevents migration of metal, and/or promotes adhesion between metal of the structured metallization layer 200 and passivation subsequently formed over the structured metallization layer 200.

In one embodiment, the protective layer 216 is formed on the side walls and top side of the structured metallization layer 200 by depositing an oxide on the structured metallization layer 200. For example, the oxide may be deposited by ALD and comprise at least one of aluminum oxide, zirconium oxide and silicon oxide. Silicon dioxide or a nitride such as silicon or boron nitride may also be used as the protective layer 216. The protective layer 216 tends to be relatively thin compared to the subsequently formed passivation. For example, the protective layer 216 may be about 2 nm to 20 nm thick. However, the protective layer 216 may have a thickness outside this range.

The thickness of the protective layer 216 may be chosen such that the protective layer 216 protects the structured metallization layer 200 from the chemistry of a subsequent passivation process, e.g., by preventing silicide from forming on the structured metallization layer 200 during the passivation process. The protective layer 216 may also ensure a good interface/adhesion between the structured metallization layer 200 and the subsequently formed passivation. In one embodiment, the structured metallization layer 200 comprises Cu and the protective layer 216 prevents copper silicide from forming on the structured metallization layer 200 during the subsequent passivation process. In general, the metal silicide prevented from forming on the structured metallization layer 200 depends on the type of metal or metal alloy used for the structured metallization layer 200.

Figure 2B:
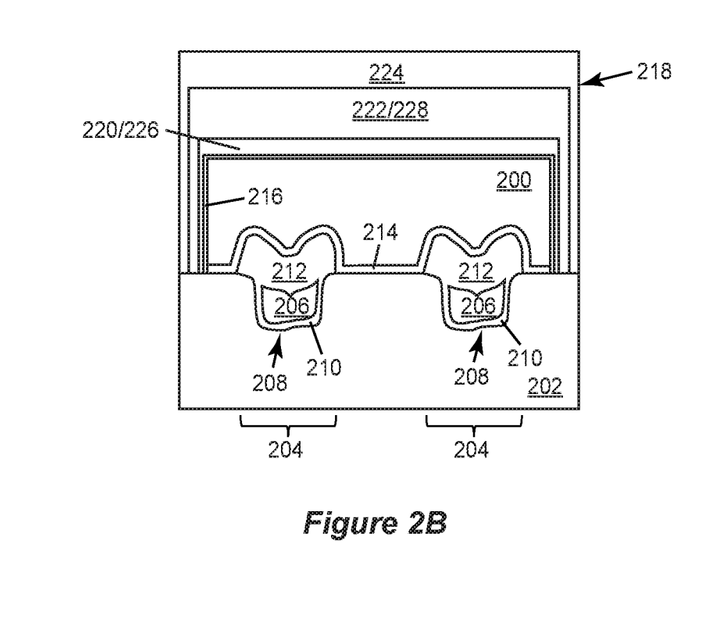

The passivation structuring and plating process further includes forming a first passivation 218 over the structured metallization layer 200 with the protective layer 216 interposed between the first passivation 218 and the structured metallization layer 200 (Block 120), as shown in FIG. 2B. The first passivation 218 may be formed such that the protective layer 216 is interposed between the first passivation 218 and the structured metallization layer 200 along the side walls and the top side of the structured metallization layer 200. The first passivation 218 protects against corrosion over the device lifetime. In one embodiment, the protective layer 216 is between 2 nm and 20 nm thick and the first passivation 218 is between 40 nm and 5 μm thick Forming the first passivation 218 may include forming a first silicon nitride layer 220 on the protective layer 216 and forming an oxide layer 222 on the first silicon nitride layer 220. Forming the first passivation 218 may further include forming a second silicon nitride layer 224 on the oxide layer 222. The thickness of the first silicon nitride layer 220 may be in a range of 40 nm to 800 nm, for example. The thickness of the oxide layer 222 may be in a range of 50 nm to 3000 nm, for example. The thickness of the second silicon nitride layer 224 may be in a range of 40 to 800 nm, for example. In another embodiment, forming the first passivation 218 includes forming an oxide layer 226 on the protective layer 216 and forming a silicon nitride layer 228 on the oxide layer 226.

Figure 2C:
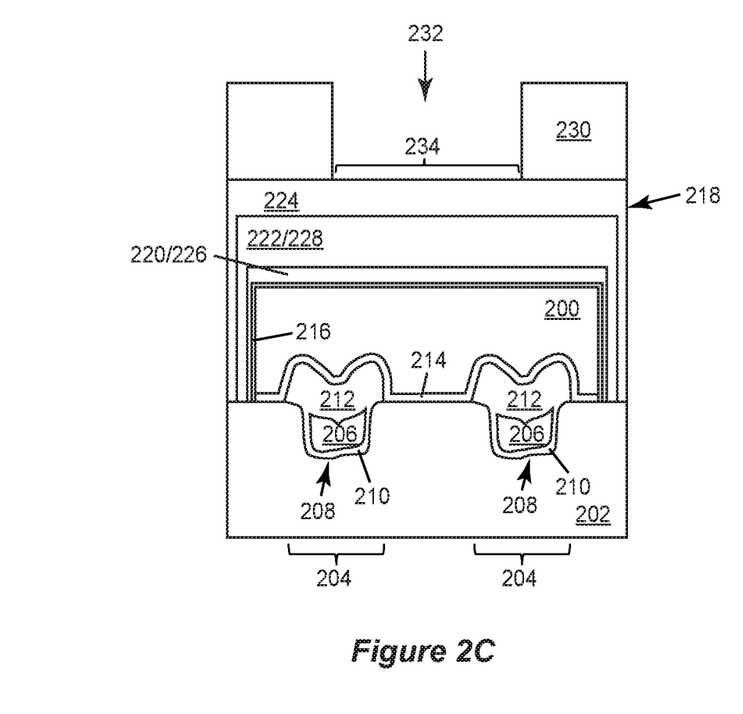
Figure 2D:
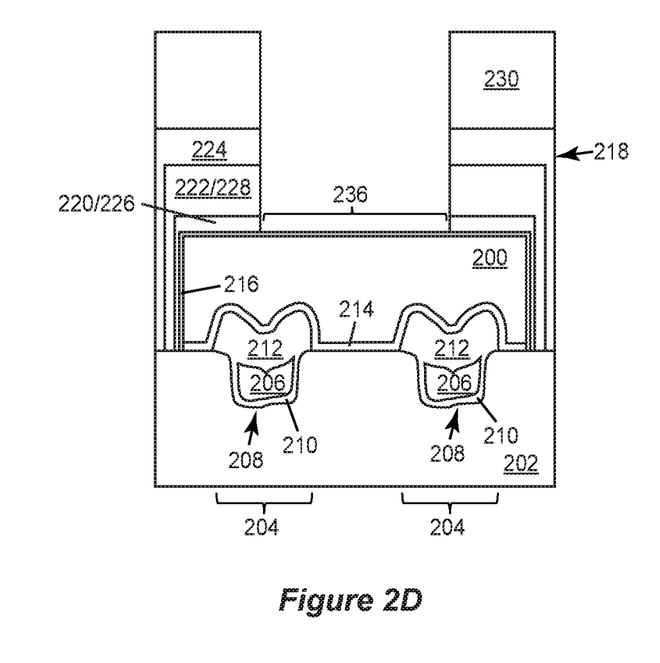

The passivation structuring and plating process further includes structuring the first passivation 218 to expose one or more regions of the protective layer 216. In one embodiment, the structuring of the first passivation 218 includes forming a patterned photoresist 230 above the first passivation 218 (Block 130). The photoresist 230 is patterned in that the photoresist 230 has one or more openings 232 that expose the underlying passivation 218, as shown in FIG. 2C. Each region 234 of the first passivation 218 unprotected by the patterned photoresist 230 is etched into (Block 140). The etching of the patterned photoresist 230 exposes one or more corresponding regions 236 of the protective layer 216, as shown in FIG. 2D.

Figure 3:
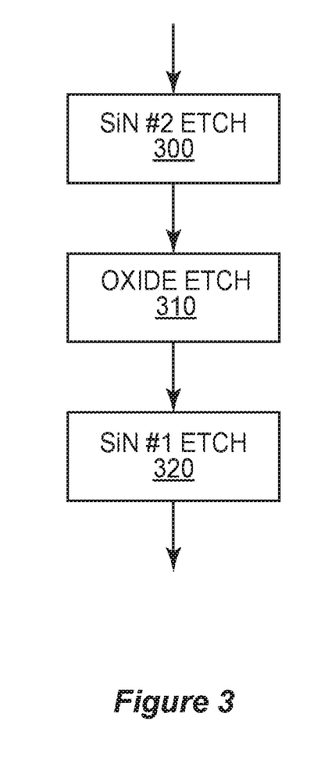
FIG. 3 illustrates a flow diagram of an embodiment of a passivation etching process.

FIG. 3 illustrates an embodiment where the first passivation 218 includes a first silicon nitride layer 220 formed on the protective layer 216, an oxide layer 222 formed on the first silicon nitride layer 220 and a second silicon nitride layer 224 formed on the oxide layer 222. According to this embodiment, etching into each region 234 of the first passivation 218 unprotected by the patterned photoresist 230 includes successively etching through each unprotected region 234 of the second silicon nitride layer 224 (Block 300), the oxide layer 222 (Block 310) and the first silicon nitride layer 220 (Block 320) unprotected by the patterned photoresist 230 to expose one or more corresponding regions 236 of the protective layer 216.

The passivation etching process depends on the materials used to form the first passivation 218. As previously explained herein, the first passivation 218 may instead include an oxide layer 226 on the protective layer 216 and a silicon nitride layer 228 on the oxide layer 226. In this case, and after structuring/etching the silicon nitride layer 228, the structured silicon nitride layer 228 may be used as a hard mask to structure/etch the underlying oxide layer 226. In each case, the passivation etching process is adapted to the types of material(s) used to form the first passivation 218.

Figure 2E:
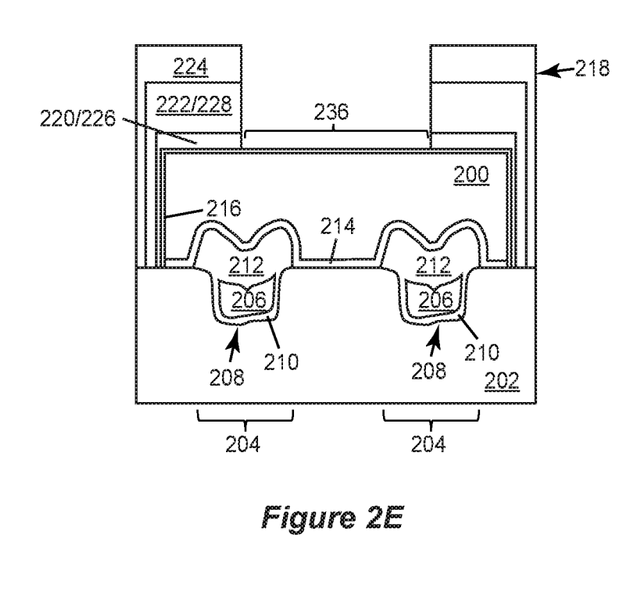

The patterned photoresist 230 may be removed from the first passivation 218 after etching of the first passivation 218 and before removing each exposed region 236 of the protective layer 216 (Block 150), as shown in FIG. 2E. The patterned photoresist 230 may be removed using any standard resist strip process.

Figure 2F:
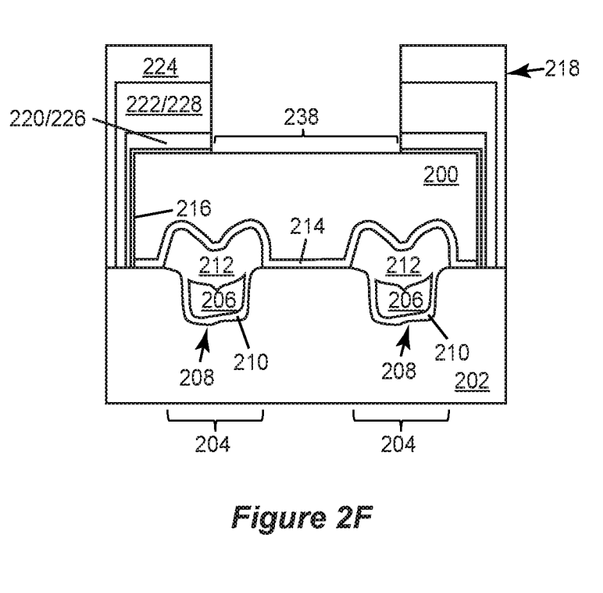

The passivation structuring and plating process further includes removing the one or more exposed regions 236 of the protective layer 216 to expose one or more parts 238 of the underlying structured metallization layer 200 (Block 160), as shown in FIG. 2F. The exposed protective layer 216 is removed to facilitate subsequent electroless plating of the underlying structured metallization layer 200. The protective layer 216 may remain on the non-exposed parts, e.g., on the side walls and/or on parts of the top side of the structured metallization layer 200.

In one embodiment, each exposed region 238 of the protective layer 216 is removed by a wet chemical etch. For example, in the case of aluminum oxide, zirconium oxide or silicon oxide as the protective layer 216, a diluted (e.g. 1%) hydrofluoric (HF) etch may be used to remove each exposed region 238 of the protective layer 216. Other etch chemistries and/or concentrations may be used such as tetramethylammonium hydroxide (TMAH), P1331 sold by Technic, etc. In general, the etch chemistry depends on the type of material used for the protective layer 216.

Figure 2G:
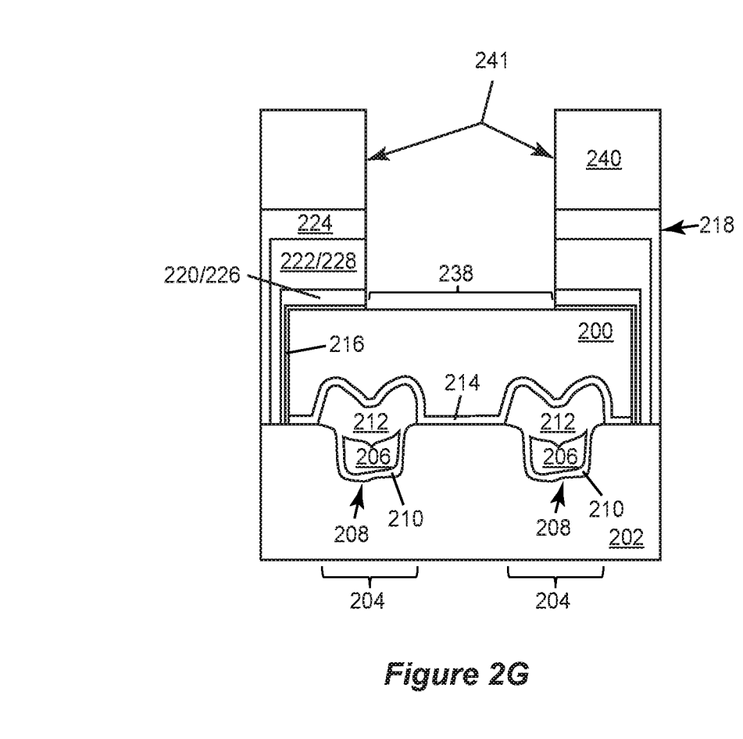

After structuring the first passivation 218 and removing each exposed region 236 of the protective layer 216, the passivation structuring and plating process further includes forming a second passivation 240 on the first passivation 218 (Block 170), as shown in FIG. 2G. The second passivation 240 protects against corrosion over the device lifetime. By forming the second passivation 240 after structuring the first passivation 218 and removing each exposed region 236 of the protective layer 216, the sidewalls 241 of the second passivation 240 are not subjected to metal contamination. In one embodiment, the second passivation 240 is an imide. The imide may have a thickness in a range of 5 μm to 20 μm. However, other polymers or other material types may be used for the second passivation 240.

Figure 2H:
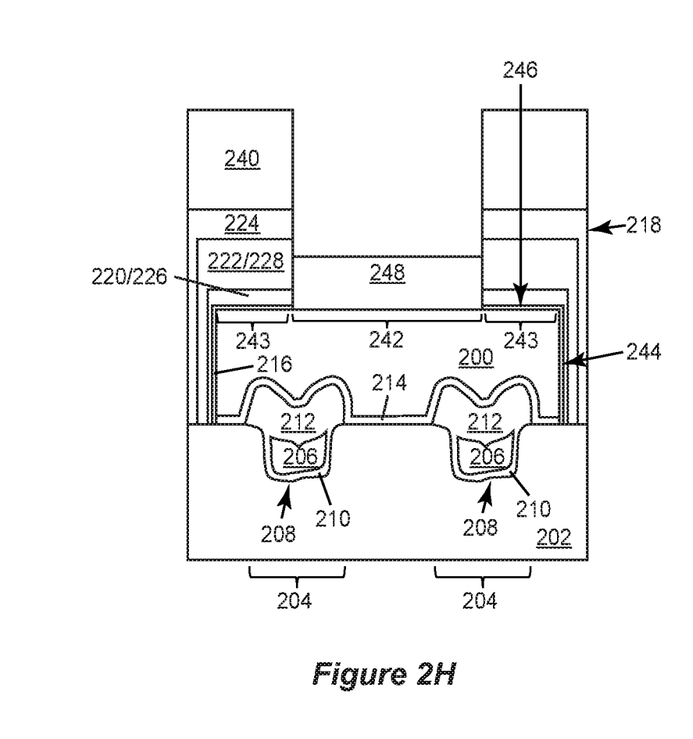

The passivation structuring and plating process further includes electroless plating of each exposed part 238 of the structured metallization layer 200 (Block 180), as shown in FIG. 2H. In one embodiment, each exposed part 238 of the structured metallization layer 200 has a contact region 242 uncovered by the first passivation 218 and the second passivation 240 and a peripheral region 243 laterally surrounding the contact region 242 and covered by the first passivation 218 and the second passivation 240. The first passivation 218 and the second passivation 240 cover a sidewall 244 and a top surface 246 of the peripheral region 243. The plating 248 formed by electroless plating covers the contact region 242 but not the peripheral region 243 of each exposed part 238 of the structured metallization layer 200.

In one embodiment, each exposed part 238 of the structured metallization layer 200 is electroless plated with a sinterable, solderable or wire-bondable material 248. The sinterable or solderable material 248 may comprise Ni, NiP, NiMoP, Pd, Ag or Au, for example. In one embodiment, the protective layer 216 is between 2 nm and 20 nm thick, the first passivation 218 is between 40 nm and 5 μm thick, and the plating 248 is between 500 nm and 5 μm thick.

After removing each exposed region 236 of the protective layer 216 and before the electroless plating of the structured metallization layer 200, the passivation structuring and plating process may further include activating each exposed part 238 of the structured metallization layer 200 for electroless deposition. The activation step removes oxide prior to subsequent plating; otherwise poor adhesion may result. The activation may include an acid dip with the type and concentration of acid determined by the chemistry of the subsequent plating bath. In general, and before electroless plating of the structured metallization layer 200, the passivation structuring and plating process may further include cleaning each exposed part 238 of the structured metallization layer 200.

Figure 4:
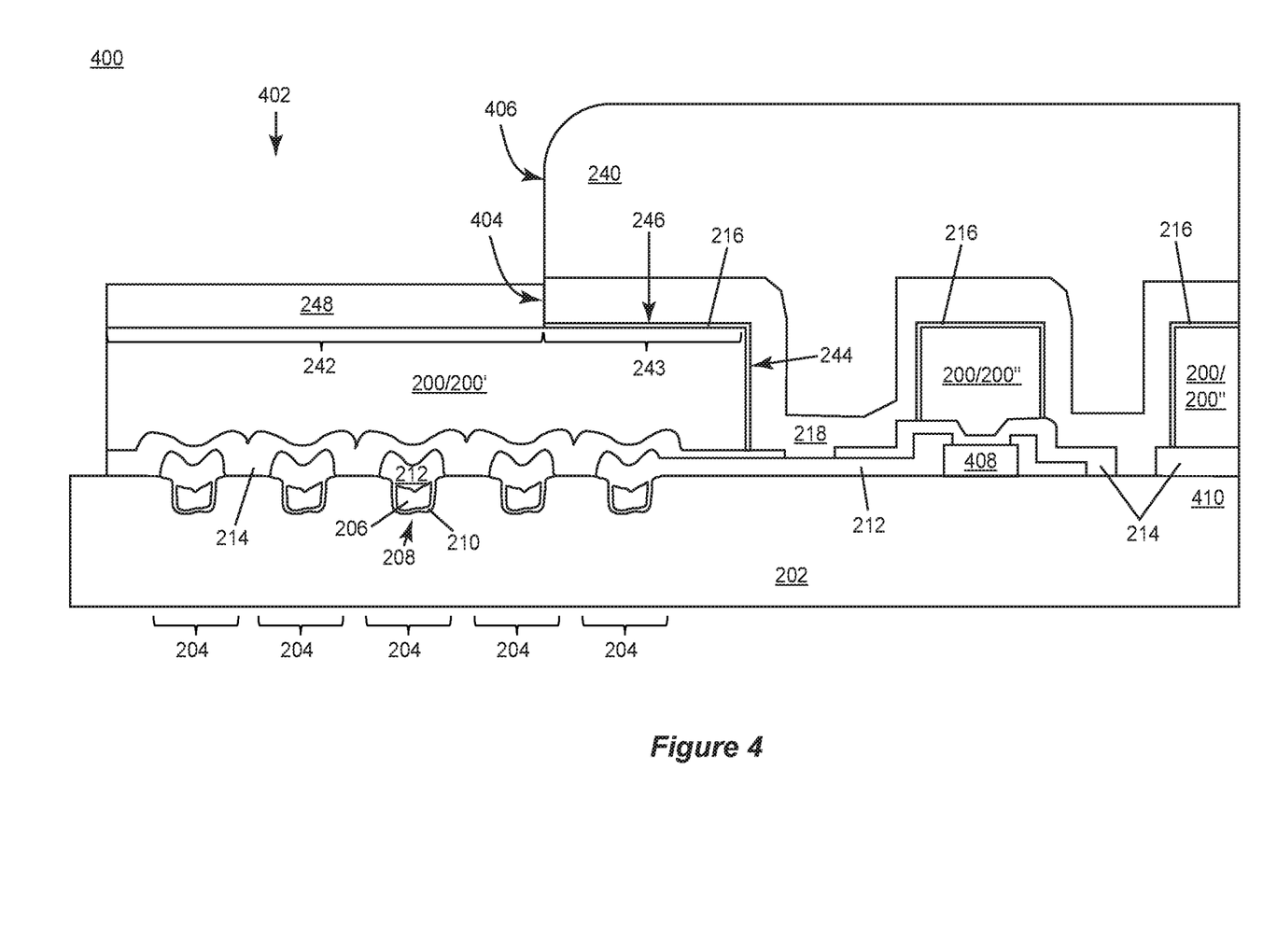
FIG. 4 illustrates a partial cross-sectional view of a power semiconductor device produced in accordance with the passivation structuring and plating process of FIG. 1.

FIG. 4 illustrates a partial cross-sectional view of a power semiconductor device 400 produced in accordance with the passivation structuring and plating process described herein. The power semiconductor device 400 includes a semiconductor substrate 202, transistor device structures 204 formed in the semiconductor substrate 202, a structured metallization layer 200 above the semiconductor substrate 202, a first passivation 218 over the structured metallization layer 200, and a second passivation 240 on the first passivation 218.

An opening 402 is formed in the first passivation 218 and the second passivation 240 over a first part 200' of the structured metallization layer 200. The first part 200' of the structured metallization layer 200 has a contact region 242 that is uncovered by the first passivation 218 and the second passivation 240 and a peripheral region 243 laterally surrounding the contact region 242 and that is covered by the first passivation 218 and the second passivation 240. The first passivation 218 and the second passivation 240 cover a sidewall 244 and a top surface 246 of the peripheral region 243. The plating 248 formed by electroless plating covers the contact region 242 but not the peripheral region 243 of the first part 200' of the structured metallization layer 200. The protective layer 216 separates the peripheral region 243 of the first part 200' of the structured metallization layer 200 from the first passivation 218.

The plating 248 that covers the contact region 242 of the first part 200' of the structured metallization layer 200 may abut an edge 404 of the first passivation 218 defined by the opening 402 formed in the first passivation 218 and the second passivation 240. The plating 248 may or may not abut an edge 406 of the second passivation 240 also defined by the same opening 402 formed in the first passivation 218 and the second passivation 240, depending on the thicknesses of the plating 248, the first passivation 218, and the protective layer 216. In one embodiment, the protective layer 216 is between 2 nm and 20 nm thick, the first passivation 218 is between 40 nm and 5 µm thick, and the plating 248 is between 500 nm and 5 µm thick.

One or more other parts 200" of the structured metallization layer 200 may be exposed and plated in other regions of the power semiconductor device 400. For example, one of these other parts 200" of the structured metallization layer 200 may provide a gate signal connection for the power semiconductor device 400. Another one of these other parts 200" of the structured metallization layer 200 may provide a field plate connection to a gate electrode structure 408 and/or an edge termination structure 410 included in the power semiconductor device 400.

Although the present disclosure is not so limited, the following numbered examples demonstrate one or more aspects of the disclosure.

Example 1. A method, comprising: forming a structured metallization layer above a semiconductor substrate; forming a protective layer on the structured metallization layer; forming a first passivation over the structured metallization layer with the protective layer interposed between the first passivation and the structured metallization layer; structuring the first passivation to expose one or more regions of the protective layer; removing the one or more exposed regions of the protective layer to expose one or more parts of the structured metallization layer; and after structuring the first passivation and removing the one or more exposed regions of the protective layer, forming a second passivation on the first passivation and electroless plating the one or more exposed parts of the structured metallization layer.

Example 2. The method of example 1, wherein the semiconductor substrate is a SiC substrate or a GaN substrate.

Example 3. The method of example 1 or 2, wherein forming the protective layer on the structured metallization layer comprises depositing an oxide or nitride on the structured metallization layer.

Example 4. The method of example 3, wherein the oxide comprises at least one of aluminum oxide, zirconium oxide, silicon oxide, silicon nitride, and boron nitride.

Example 5. The method of any of examples 1 through 4, wherein forming the first passivation over the structured metallization layer comprises: forming a first silicon nitride layer on the protective layer; and forming an oxide layer on the first silicon nitride layer.

Example 6. The method of example 5, wherein forming the first passivation over the structured metallization layer further comprises: forming a second silicon nitride layer on the oxide layer.

Example 7. The method of any of examples 1 through 4, wherein forming the first passivation over the structured metallization layer comprises: forming an oxide layer on the protective layer; and forming a silicon nitride layer on the oxide layer.

Example 8. The method of any of examples 1 through 7, wherein structuring the first passivation comprises: forming a patterned photoresist above the first passivation; and etching into each region of the first passivation unprotected by the patterned photoresist.

Example 9. The method of example 8, further comprising: before removing the one or more exposed regions of the protective layer, removing the patterned photoresist from the first passivation.

Example 10. The method of example 9, wherein the first passivation comprises a first silicon nitride layer formed on the protective layer, an oxide layer formed on the first silicon nitride layer and a second silicon nitride layer formed on the oxide layer, wherein etching into each region of the first passivation unprotected by the patterned photoresist comprises successively etching through each region of the second silicon nitride layer, the oxide layer and the first silicon nitride layer unprotected by the patterned photoresist, and wherein the patterned photoresist is removed from the first passivation after the successive etching.

Example 11. The method of any of examples 1 through 10, wherein the one or more exposed regions of the protective layer are removed by a wet chemical etch.

Example 12. The method of any of examples 1 through 11, wherein the one or more exposed parts of the structured metallization layer are electroless plated with a sinterable, solderable or wire-bondable material.

Example 13. The method of example 12, wherein the sinterable or solderable material comprises Ni, NiP, Pd, Ag or Au.

Example 14. The method of any of examples 1 through 13, further comprising: after removing the one or more exposed regions of the protective layer and before electroless plating the one or more exposed parts of the structured metallization layer, activating the one or more exposed parts of the structured metallization layer for electroless deposition.

Example 15. The method of any of examples 1 through 14, further comprising: before electroless plating the one or more exposed parts of the structured metallization layer, cleaning the one or more exposed parts of the structured metallization layer.

Example 16. The method of any of examples 1 through 15, wherein the protective layer is between 2 nm and 20 nm thick, and wherein the first passivation is between 40 nm and 5 μm thick.

Example 17. The method of any of examples 1 through 16, wherein the structured metallization layer is a structured Cu layer, a structured AlCu layer, a structured Ag layer, or a structured Au layer.

Example 18. The method of any of examples 1 through 17, wherein the protective layer prevents silicide from forming on the structured metallization layer during formation of the first passivation.

Example 19. The method of example 18, wherein the structured metallization layer comprises Cu, and wherein the protective layer prevents copper silicide from forming on the structured metallization layer during formation of the first passivation.

Example 20. A power semiconductor device, comprising: a semiconductor substrate; transistor device structures formed in the semiconductor substrate; a structured metallization layer above the semiconductor substrate; a first passivation over the structured metallization layer; a second passivation on the first passivation; an opening formed in the first passivation and the second passivation such that a first part of the structured metallization layer has a contact region uncovered by the first passivation and the second passivation and a peripheral region laterally surrounding the contact region and covered by the first passivation and the second passivation, the first passivation and the second passivation covering a sidewall and a top surface of the peripheral region; a plating that covers the contact region but not the peripheral region of the first part of the structured metallization layer; and a protective layer separating the peripheral region of the first part of the structured metallization layer from the first passivation.

Example 21. The power semiconductor device of example 20, wherein the plating abuts an edge of the first passivation defined by the opening formed in the first passivation and the second passivation.

Example 22. The power semiconductor device of example 20 or 21, wherein the protective layer is between 2 nm and 20 nm thick, wherein the first passivation is between 40 nm and 5 μm thick, and wherein the plating is between 500 nm and 5 μm thick.

Example 23. The power semiconductor device of any of examples 20 through 22, wherein the protective layer is configured to prevent silicide formation, and/or prevent migration of metal, and/or promote adhesion between metal of the metallization and the first passivation.

Example 24. The power semiconductor device of any of examples 20 through 23, wherein the protective layer comprises at least one of aluminum oxide, zirconium oxide, silicon oxide, silicon nitride, and boron nitride.

Example 25. The power semiconductor device of any of examples 20 through 24, wherein the first passivation comprises a first silicon nitride layer on the protective layer and an oxide layer on the first silicon nitride layer.

Example 26. The power semiconductor device of example 25, wherein the first passivation further comprises a second silicon nitride layer on the oxide layer.

Example 27. The power semiconductor device of any of examples 20 through 26, wherein the first passivation comprises an oxide layer on the protective layer and a silicon nitride layer on the oxide layer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    forming a structured metallization layer above a semiconductor substrate;
    forming a protective layer on the structured metallization layer;
    forming a first passivation over the structured metallization layer with the protective layer interposed between the first passivation and the structured metallization layer;
    structuring the first passivation to expose one or more regions of the protective layer;
    removing the one or more exposed regions of the protective layer to expose one or more parts of the structured metallization layer;
    after structuring the first passivation and removing the one or more exposed regions of the protective layer, forming a second passivation on the first passivation and electroless plating the one or more exposed parts of the structured metallization layer.

2. The method of claim 1, wherein the semiconductor substrate is a SiC substrate or a GaN substrate.

3. The method of claim 1, wherein forming the protective layer on the structured metallization layer comprises depositing an oxide or nitride on the structured metallization layer.

4. The method of claim 3, wherein the oxide or nitride comprises at least one of aluminum oxide, zirconium oxide, silicon oxide, silicon nitride, and boron nitride.

5. The method of claim 1, wherein forming the first passivation over the structured metallization layer comprises:
    forming a first silicon nitride layer on the protective layer; and
    forming an oxide layer on the first silicon nitride layer.

6. The method of claim 5, wherein forming the first passivation over the structured metallization layer further comprises:
    forming a second silicon nitride layer on the oxide layer.

7. The method of claim 1, wherein forming the first passivation over the structured metallization layer comprises:
    forming an oxide layer on the protective layer; and
    forming a silicon nitride layer on the oxide layer.

8. The method of claim 1, wherein structuring the first passivation comprises:
   forming a patterned photoresist above the first passivation; and
   etching into each region of the first passivation unprotected by the patterned photoresist.

9. The method of claim 8, further comprising:
   before removing the one or more exposed regions of the protective layer, removing the patterned photoresist from the first passivation.

10. The method of claim 9, wherein the first passivation comprises a first silicon nitride layer formed on the protective layer, an oxide layer formed on the first silicon nitride layer and a second silicon nitride layer formed on the oxide layer, wherein etching into each region of the first passivation unprotected by the patterned photoresist comprises successively etching through each region of the second silicon nitride layer, the oxide layer and the first silicon nitride layer unprotected by the patterned photoresist, and wherein the patterned photoresist is removed from the first passivation after the successive etching.

11. The method of claim 1, wherein the one or more exposed regions of the protective layer are removed by a wet chemical etch.

12. The method of claim 1, wherein the one or more exposed parts of the structured metallization layer are electroless plated with a sinterable, solderable or wire-bondable material.

13. The method of claim 12, wherein the sinterable or solderable material comprises Ni, NiP, Pd, Ag or Au.

14. The method of claim 1, further comprising:
   after removing the one or more exposed regions of the protective layer and before electroless plating the one or more exposed parts of the structured metallization layer, activating the one or more exposed parts of the structured metallization layer for electroless deposition.

15. The method of claim 1, further comprising:
   before electroless plating the one or more exposed parts of the structured metallization layer, cleaning the one or more exposed parts of the structured metallization layer.

16. The method of claim 1, wherein the protective layer is between 2 nm and 20 nm thick, and wherein the first passivation is between 40 nm and 5 µm thick.

17. The method of claim 1, wherein the structured metallization layer is a structured Cu layer, a structured AlCu layer, a structured Ag layer, or a structured Au layer.

18. The method of claim 1, wherein the protective layer prevents silicide from forming on the structured metallization layer during formation of the first passivation.

19. The method of claim 18, wherein the structured metallization layer comprises Cu, and wherein the protective layer prevents copper silicide from forming on the structured metallization layer during formation of the first passivation.

* * * * *